(12) United States Patent
Tanaka et al.

(10) Patent No.: US 6,356,717 B2
(45) Date of Patent: Mar. 12, 2002

(54) FLEXIBLE CIRCUIT BOARD

(75) Inventors: Yasuhiko Tanaka; Minoru Ishiguro; Yukio Okazaki, all of Saitama (JP)

(73) Assignee: Fuji Photo Optical Co., Ltd., Saitama (JP)

(*) Notice: Subject to any disclaimer, the term of this patent is extended or adjusted under 35 U.S.C. 154(b) by 0 days.

(21) Appl. No.: 09/793,777

(22) Filed: Feb. 27, 2001

(30) Foreign Application Priority Data

Feb. 29, 2000 (JP) .......................................... 12-054338

(51) Int. Cl.[7] .............................................. G03B 17/00
(52) U.S. Cl. ...................................................... 396/542
(58) Field of Search ......................................... 396/542

(56) References Cited

U.S. PATENT DOCUMENTS 5,181,065 A * 1/1993 Hara ........................... 396/542

* cited by examiner

Primary Examiner—David M. Gray
Assistant Examiner—Rochelle Blackman
(74) Attorney, Agent, or Firm—Young & Thompson

(57) ABSTRACT

A flexible circuit board has a magnetic head interface IC soldered on a tongue-shaped portion, which is folded such that the magnetic head interface IC is put inside. A front and a rear side of the magnetic head interface IC is covered with shield patterns. After exposure, the magnetic head interface IC drives the magnetic head to record some information of photography to a recording area in a photo film. When an film cartridge is loaded, the information in the recording area is read out for finding an unexposed frame. In recording and reading, the shield patterns absorb magnetic waves generated nearby the magnetic head interface IC, so that recording and reading signals are not interfered.

8 Claims, 5 Drawing Sheets

FLEXIBLE CIRCUIT BOARD

FIELD OF THE INVENTION

The invention relates to a flexible circuit board that is assembled as an electronic part in portable apparatuses such as cameras, and is capable of shielding a circuit element from electromagnetic waves.

BACKGROUND OF THE INVENTION

In a portable apparatus such as a camera, a flexible circuit board is used for assembling lots of electronic parts herein, and for connecting the electronic parts to each other. The flexible circuit board includes conductive wiring patterns formed on a flexible insulating sheet by photo etching or the like. Electronic devices, such as an IC, a photo sensor and so on, are placed at suitable positions on the flexible circuit board and are connected to each other. In general, the front and rear surfaces of the flexible circuit board are covered with insulating layers for preventing a wiring pattern from being conducted to other wiring pattern formed on other circuit board. If necessary, the flexible circuit board is folded inside the portable apparatus.

A camera for IX240 type has a magnetic head and an interface IC for recording magnetically to a photo film. In IX240 type photo film, a magnetic recording area is provided outside of each frame. In feeding the photo film after a photography, the interface IC sends signals including some information of the photography to the magnetic head, in which the information is recorded magnetically on the magnetic recording area of the photo film. This information includes a taking date, whether flash light is projected, and so on. This recorded information is read out in printing operation.

In addition, some cameras are able to use a halfway used photo film cartridge in which unexposed frames remain. When this cartridge is loaded in the camera, the photo film is fed from the cartridge. In feeding, information of a previous photography recorded in the recording area is read out by the magnetic head, and signals including the information is sent to the interface IC, so that the camera can detect exposed frames. When no information of a previous photography is read out, the camera stops feeding the photo film and is on standby for photography.

The camera has lots of circuit elements such as a main CPU for controlling sequence of a photography, a flash circuit, an auto focusing circuit, an LCD panel for displaying information, an LCD driver and switches that are turned on and off according to external operation. Some of them are placed on the flexible circuit board on which the magnetic head interface IC is placed.

In reproducing a signal sent from the magnetic head, a current can be flown through a wiring pattern nearby the interface IC for sending a signal that is indifferent to. The current generates an electromagnetic wave that interferes with the reproductive signal as noise. Thus, misreading of the information is likely to occur. Since peculiar frequency modulation is used in magnetic recording onto the recording area in the photo film, even a small signal of high frequency generated nearby the interface IC may cause misreading.

SUMMARY OF THE INVENTION

The present invention is to provide a flexible circuit substance for protecting a circuit element against noise generated by a current flown near the circuit element.

To achieve the above objects, a flexible circuit board of the present invention is comprised of an insulating sheet with flexibility which has a first surface and a second surface, a first portion provided in the insulating sheet, a first circuit element that is provided on the first surface of the first portion and connected to a part of the wiring patterns, a first shield pattern formed on the second surface of the first portion, and a second shield pattern formed on the remnant portion in association with the first shield pattern. The first portion is folded onto a remnant portion of the insulating sheet with the first surface inside, The first and second shield patterns guard a front and a rear surfaces of the first circuit element against electromagnetic waves. Thereby, it is possible to prevent a circuit element from being interfered with electromagnetic waves from a wiring pattern nearby the circuit element.

In the embodiment, the wiring patterns are formed on the second surface. A U-shaped first opening is formed around the first portion, which is folded such that a folded portion is formed along a line that connects both end of the first opening. The flexible circuit includes at least one second opening that is formed on the line, a second circuit element that is disposed outside the folded portion, and at least one terminal attached to the second circuit element. The terminal is connected to said first circuit element through said second opening.

The flexible circuit board is integrated into a camera for exposing a subject image onto a photo film. The second circuit element is a magnetic head for recording information of photography onto a magnetic recording layer and for reading information magnetically. The first circuit element is a magnetic head interface IC for reproducing signals that is read out by the magnetic head and for sending information of photography to the magnetic head.

BRIEF DESCRIPTION OF THE DRAWINGS

The above and other objects and advantages of the present invention will become apparent from the following detailed description of the preferred embodiments when read in association with the accompanying drawings, which are given by way of illustration only and thus are not limiting the present invention. In the drawings, like reference numerals designate like or corresponding parts throughout the several views, and wherein.

DETAILED DESCRIPTION OF THE INVENTION

Figure 1:
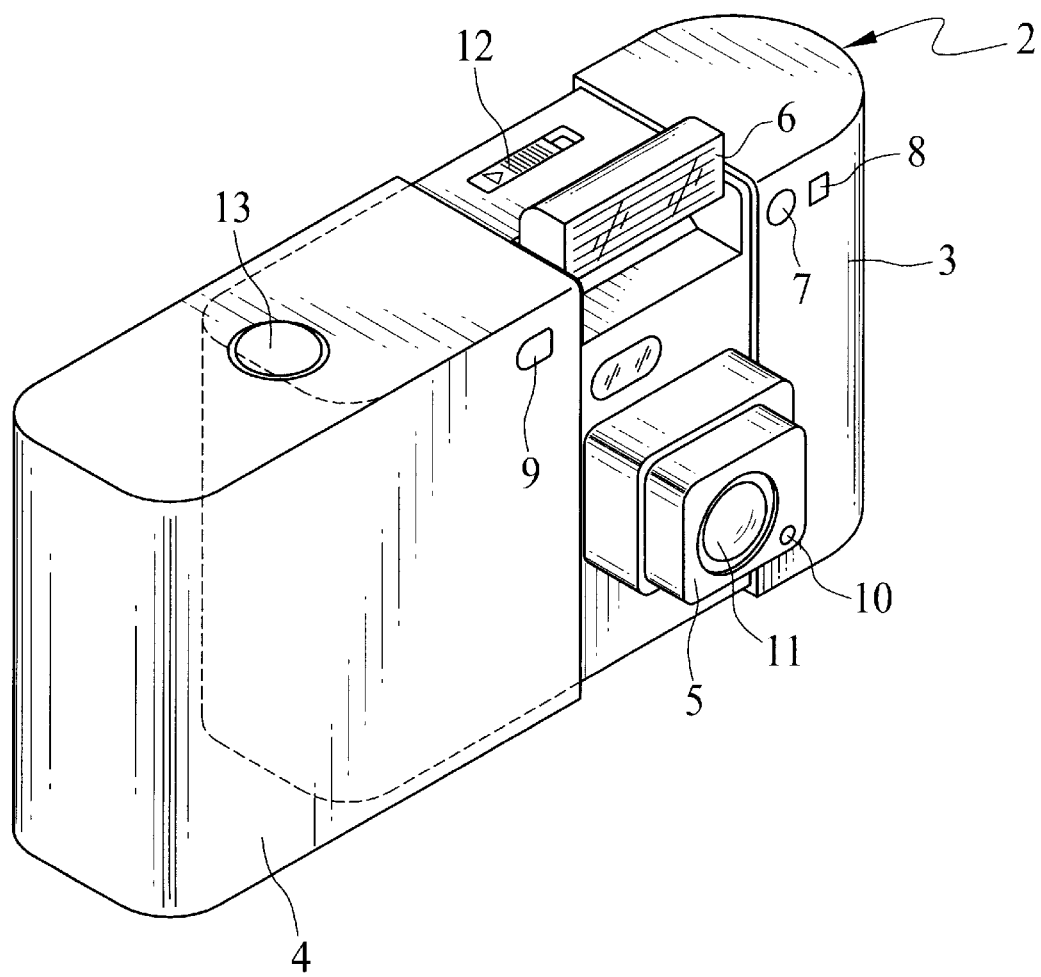
FIG. 1 is a front perspective view showing a camera having a flexible circuit substance of the present invention.

FIG. 1 shows a perspective of a camera 2 with a flexible circuit board of the present invention. The camera 2 includes a camera body 3 and a slide cover 4. The camera body 3 has a roughly rectangular shape and incorporates kinds of taking mechanisms. The slide cover 4 is made of light and high-strength material such as aluminum or titanium, and covers the one side of the camera body 3. In taking, the slide cover 4 is located at a taking position shown in FIG. 1, in which the slide cover 4 is used as a grip portion. When the camera 2 is unused, the slide cover 4 is located at a closed position to cover a large part of the camera body 3. At the closed position, roughness of the surface of the camera body 3 is disappeared and the volume of the camera 2 becomes small. Thus, portability of the camera 2 improves.

In taking, a lens barrel 5, a flash projector 6, an objective viewfinder window 7, a light projecting window 8 and a light receiving window 9 are appeared in a front surface of the camera 2. The lens barrel 5 has a photometry window 10 and a taking lens 11. The lens barrel 5 is retracted inside the camera body 3 while the camera 2 is not powered, and protruded from the camera body 3 as the camera 2 is powered. The flash projector 6 is pivotally attached to the camera body 3 between a stored position and a protruded position. When the slide cover 4 is at the closed position, the flash projector 6 is kept at the stored position, in which the flash projector 6 is stored inside the camera body 3. According to the movement of the glide cover 4 to the taking position, the flash projector 6 rotates from the stored position to the protruded position by a bias of a spring that is attached to one end of the flash projector 6. The rotation of the flash projector 6 makes a power switch of the camera 2 turn on.

A lock release member 12 is provided on an upper side of the camera body 3. The camera body 3 has a cover lock mechanism (not shown) for keeping the slide cover 4 from being slid over the taking position. When the lock release member 12 is operated, the slide cover 4 is released and allowed to slide over the taking position, so that a cartridge chamber in the camera body 3 is opened.

A shutter release button 13 is provided on an upper side of the slide cover 4. When the slide cover 4 is located at the taking position, the shutter button 13 is just above a shutter switch for driving a focusing device, a photometry device and a shutter driving mechanism in the camera body 3. When the shutter release button 13 is halfway depressed, the focusing device and the photometry device are driven for carrying out auto-focusing and photometry. Upon fully depressed the shutter release button 13, the shutter driving mechanism is driven to carry out one exposure.

Figure 2:
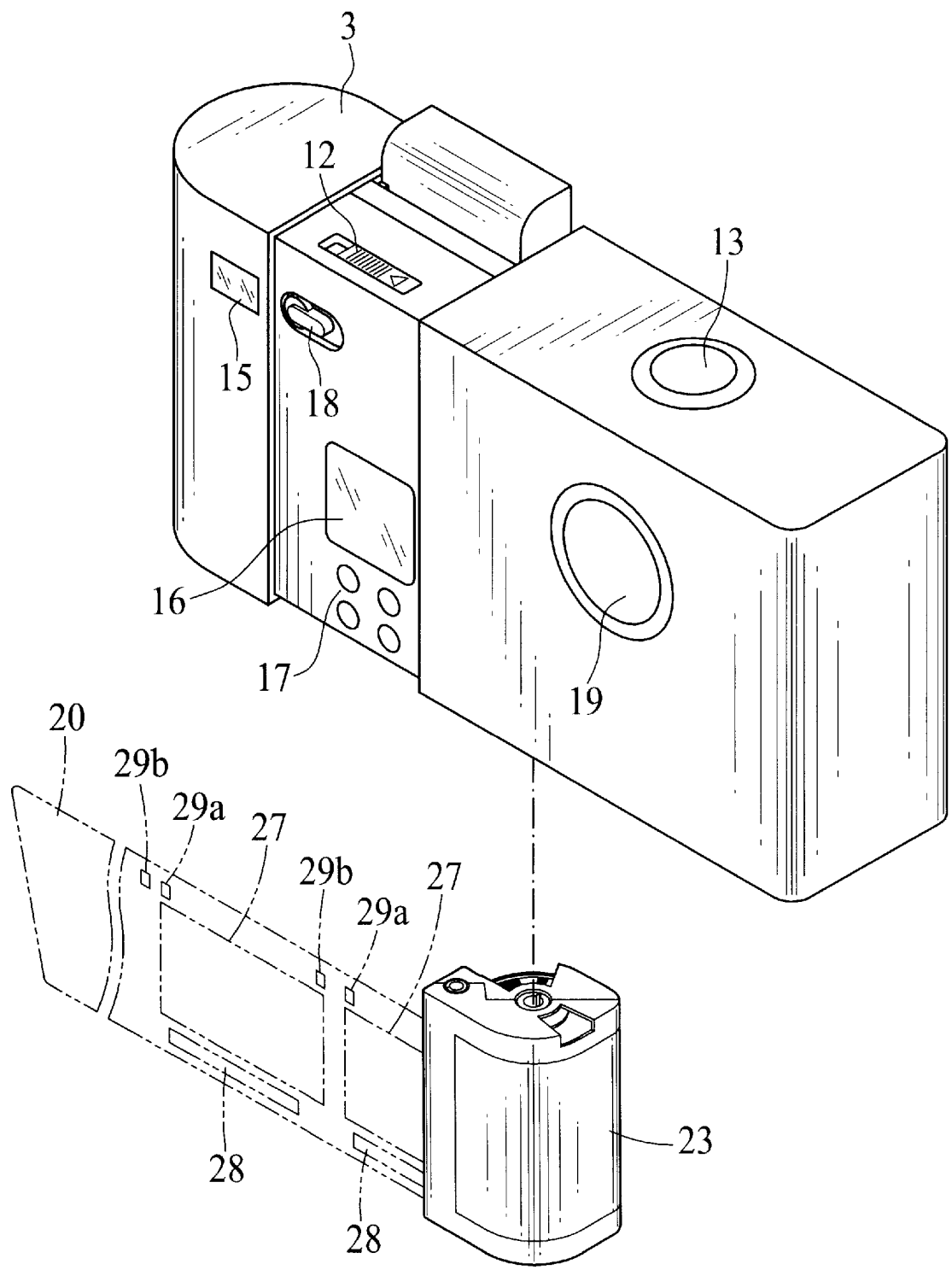
FIG. 2 is a rear perspective view showing a camera of FIG. 1.

As shown in FIG. 2, a eyepiece window 15, a LCD panel 16, setting switches 17, a print size selective switch 18 and a zoom button 19 are provided on a rear side of the camera body 3. The setting switches 17 includes a halfway rewind switch. When the slide cover 4 is slid to the taking position, the zoom button 19 is faced to a half-round-shaped zoom switches in the camera body 3 for moving the lens barrel 5.

When the slide lever 4 is moved over the taking position, the cartridge chamber is opened for exchanging a film cartridge 23. A belt-shaped photo film 20 is contained inside the film cartridge 23. Each time a photography is carried out, the photo film 20 is pulled out of the film cartridge 23 by one frame. The photo film has plural of frames, each of which includes a exposure area 27, a recording area 28 and perforations 29a and 29b. When the shutter release button is fully depressed, subject light is exposed to the whole exposure area 27. The recording area 28 has a magnetic recording layer to record some information about photography.

Figure 3:
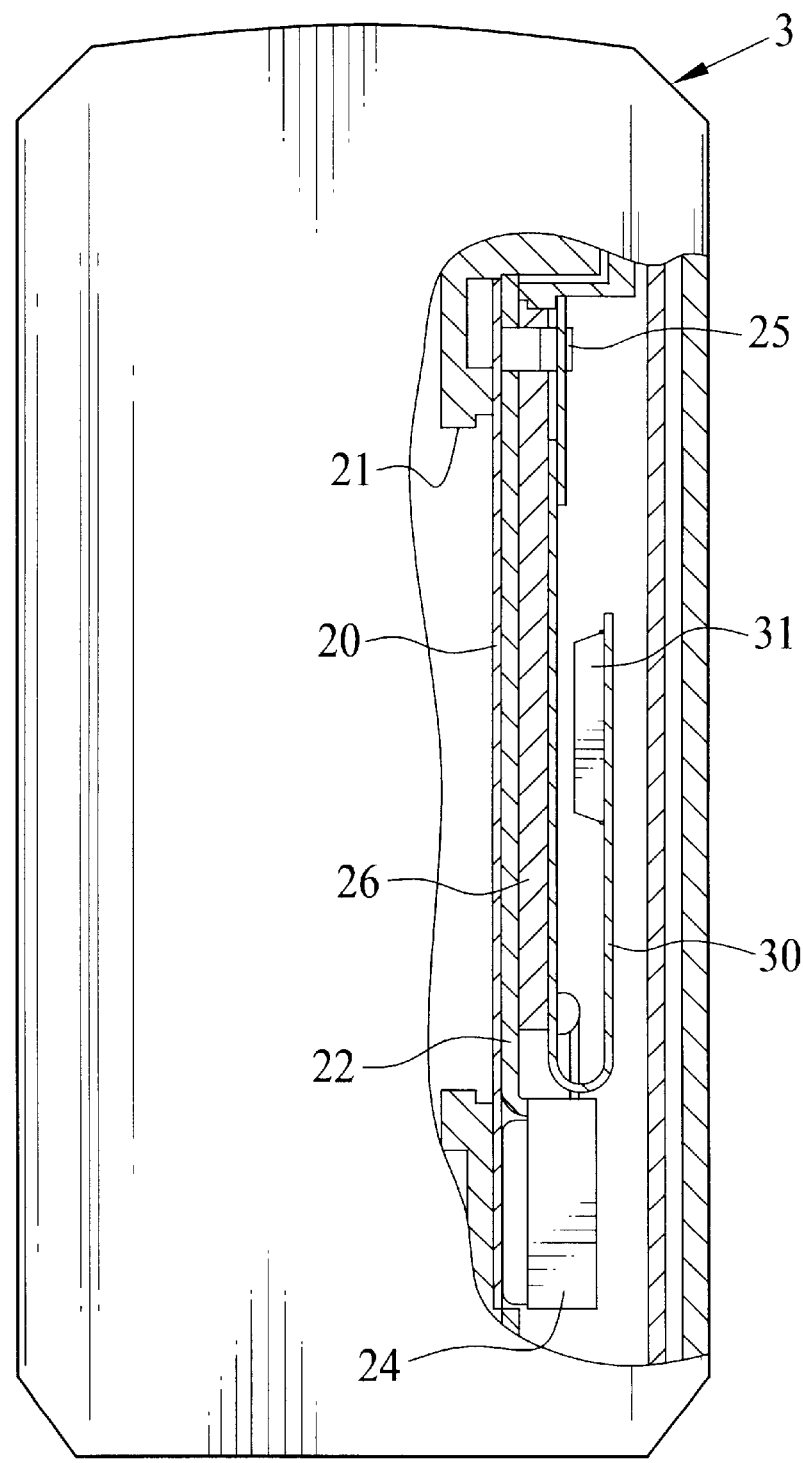
FIG. 3 is a partial cross section of the camera of FIG. 1.
Figure 4:
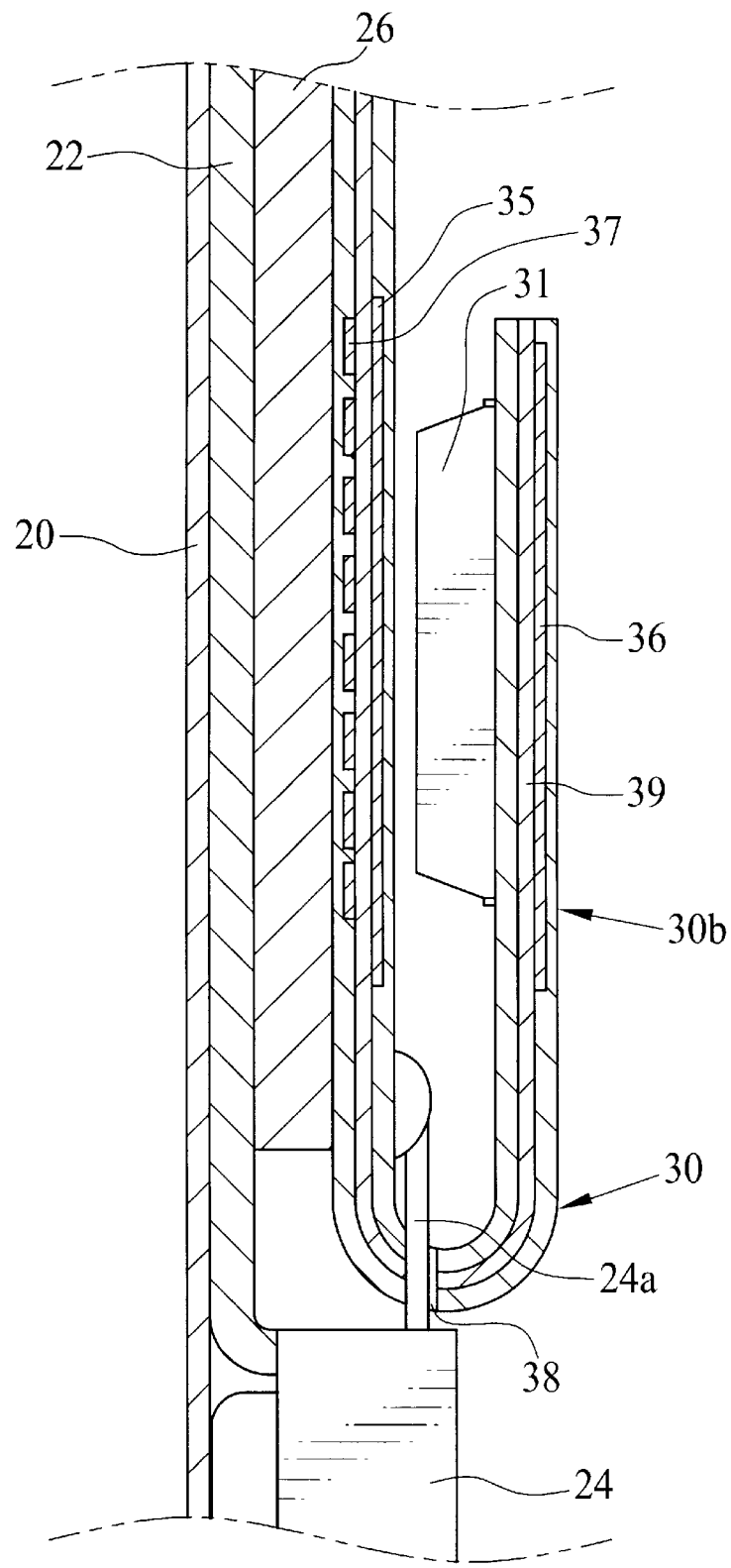
FIG. 4 is a schematic view of the flexible circuit substance of the present invention.

FIG. 3 shows a cross sectional view of the camera 2, and FIG. 4 is an enlarged drawing thereof. As shown in FIG. 3, the photo film 20 is disposed in a film passage formed between an exposure frame 21 and a pressure plate 22. The pressure plate 22 has a pin (not shown) that is fit into a positioning hole in the camera body 3, so that the pressure plate 22 determines its position with high accuracy. Thus, the whole exposure area 27 of the photo film 20 is touched to the pressure plate 22 in the same condition.

A magnetic head 24 is fixed behind the pressure plate 22. A read/write surface of the magnetic head 24 is protruded toward the photo film 20 through an opening in the pressure plate 22, and is located in the same plane of the front surface of the pressure plate 22. The pressure plate 22 is located at the certain position in the camera body 3 with high accuracy. Thus, by fixing the magnetic head 24 based on the pressure plate 22, the magnetic head 24 is able to touch the photo film 20 with a certain pressure. After exposure, the magnetic head 24 writes some information magnetically onto the recording area 28. The information includes a date of photography or whether a flash device is used, and so on.

A perforation sensor 25 is disposed in an upper portion of a magnetic head 24. A reflection photo sensor is used as the perforation sensor 25. The perforation sensor 25 monitors feeding amount of the photo film 20 by detecting perforations 29a and 29b optically.

When a film cartridge 23 is loaded inside the camera body 3, a photo film 20 is fed from the film cartridge 23. In feeding, the magnetic head 24 tries to read information from the recording area 28. If the exposure area 27 is not exposed, no information is written in the recording area 28. If the magnetic head 24 detects no information from the recording area 28, the camera 2 stops feeding the photo film 20.

The rear surface of the pressure plate 22 is stuck to one side of a resinous plate 26. Plural pins (not shown) are protruded from the opposite side of the resinous plate 26, and insert into plural holes that are formed in a flexible circuit board 30. Thus, the flexible circuit board 30 is held to the resinous plate 26.

The flexible circuit board 30 includes a flexible insulating sheet 39 and conductive wiring patterns formed on both sides of the flexible insulating sheet 39 by photo etching method or the like. In order to prevent a wiring pattern from being conducted to other wiring pattern formed on other circuit board, the conductive wiring patterns are covered with insulating material.

Figure 5:
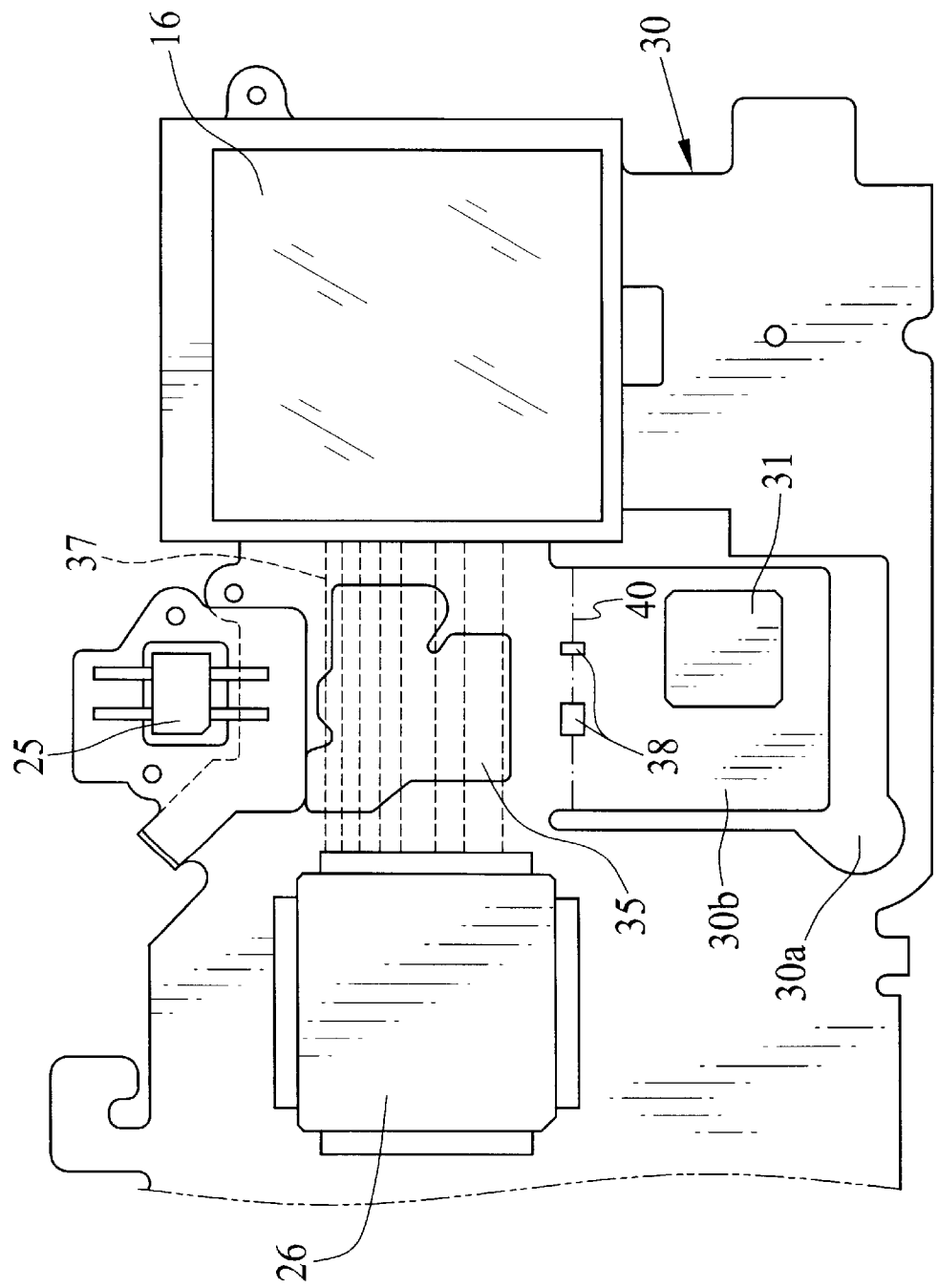
FIG. 5 is a plain view of the flexible circuit substance.

As shown in FIG. 5, kinds of circuit elements, such as a magnetic head interface IC 31, a CPU 26, the perforation sensor 25 and so on, are soldered on the flexible circuit board 30. A roughly U-shaped hole 30a is formed in a lower area of the flexible circuit board 30, so that a tongue-shaped portion 30b is formed. The magnetic head interface IC 31 is soldered on the front surface of the tongue-shaped portion 30b. In assembling, a one-dotted line 40 in the tongue-shaped portion 30b is folded such that the magnetic head interface IC 31 is put inside.

The flexible circuit board 30 has two shield patterns 35 and 36. The shield pattern 35 is formed in an area where the folded tongue-shaped portion 30b is faced to. The shield pattern 36 is formed on the rear surface of the tongue-shaped portion 30b. These shield patterns 35 and 36, which are connected to earth, shield the magnetic head interface IC 31 from electromagnetic waves. Behind the shield pattern 35 are formed a plurality of wiring patterns 37 for connecting the CPU 26 and the LCD panel 16. In assembling, the front and rear surfaces of the magnetic head interface IC 31 are covered with the shield patterns 35 and 36.

Two holes 38 are formed on the one-dotted line 40 of the tongue-shaped portion 30b. The magnetic head 24 has terminals 24a for connecting the magnetic head 24 to the magnetic head interface IC 31. The terminals 24a insert into the holes 38 and are soldered onto a wiring pattern in the flexible circuit board 30. Thus, it is possible to lower the length of the terminals 24.

When a film cartridge 23 is loaded inside the camera body 3, a photo film 20 is fed from the film cartridge 23. In feeding, the magnetic head 24 reads magnetic signals in the recording area 28, and sends it to the magnetic head interface IC 31 for reproducing information about previous photography. In reproducing, the heads interface IC 31 is shielded from electromagnetic waves generated by a current flown through the wiring patterns 37 and flies towards the magnetic head interface IC 31. Since reproduction signals in the magnetic head interface IC 31 is not interfered by noise like this, it is possible to prevent faulty operation caused by misreading.

In the above described embodiment, magnetic head interface IC is applied as a circuit element for preventing interference by noise, but the present invention is applicable to other circuit elements such as a photometry IC and a main CPU. In addition, a camera is applied as an apparatus having a flexible circuit board, other apparatuses having a flexible circuit board may be applicable.

Thus, the present invention is not to be limited to the above embodiments, but on the contrary, various modifications are possible to those skilled in the art without departing from the scope of claims appended hereto.

What is claimed is:

1. A flexible circuit board integrated into an electronic device, and having a plurality of wiring patterns, said flexible circuit board comprising:

an insulating sheet with flexibility, said insulating sheet having a first surface and a second surface;

a first portion provided in said insulating sheet, said first portion being folded onto a remnant portion of said insulating sheet with said first surface inside;

a first circuit element that is provided on said first surface of said first portion, said first circuit element being connected to a part of said wiring patterns;

a first shield pattern that is formed on said second surface of said first portion; and a second shield pattern formed on said remnant portion in association with said first shield pattern, said first and second shield patterns guarding a front and a rear surface of said first circuit element against electromagnetic waves.

2. A flexible circuit board as claimed in claim 1, wherein said a plurality of wiring patterns are formed on said second surface.

3. A flexible circuit board integrated into an electronic device, and having a plurality of wiring patterns, said flexible circuit board comprising:

an insulating sheet with flexibility, said insulating sheet having a first surface and a second surface;

a first portion provided in said insulating sheet, said first portion being folded onto a remnant portion of said insulating sheet with said first surface inside;

a first circuit element that is provided on said first surface of said first portion, said first circuit element being connected to a part of said wiring patterns;

a first shield pattern that is formed on said second surface of said first portion; and a second shield pattern formed on said remnant portion in association with said first shield pattern, said first and second shield patterns guarding a front and a rear surfaces of said first circuit element against electromagnetic waves;

wherein said a plurality of wiring patterns are formed on said second surface;

wherein a U-shaped first opening is formed around said first portion, said first portion being folded such that a folded portion is formed along a line that connects both ends of said first opening.

4. A flexible circuit board integrated into an electronic device, and having a plurality of wiring patterns, said flexible circuit board comprising:

an insulating sheet with flexibility, said insulating sheet having a first surface and a second surface;

a first portion provided in said insulating sheet, said first portion being folded onto a remnant portion of said insulating sheet with said first surface inside;

a first circuit element that is provided on said first surface of said first portion, said first circuit element being connected to a part of said wiring patterns;

a first shield pattern that is formed on said second surface of said first portion;

a second shield pattern formed on said remnant portion in association with said first shield pattern, said first and second shield pattern guarding a front and a rear surface of said first circuit element against electromagnetic waves;

at least one opening being formed on a folded portion where said first portion is folded;

a second circuit element being disposed outside said folded portion; and at least one terminal attached to said second circuit element, said terminal being connected to said first circuit element through said second opening.

5. A flexible circuit board as claimed in claim 4, wherein said second circuit element is a magnetic head for recording information magnetically and for reading information that is recorded magnetically, and said first circuit element is a magnetic head interface IC for reproducing signals that is read out by said magnetic head and for sending information for recording to said magnetic head.

6. A flexible circuit board as claimed in claims 4, wherein said electronic device is a camera for recording a subject image onto a photo films.

7. A flexible circuit board as claimed in claim 6, wherein said photo film has a magnetic recording layer in which information of photography is recorded.

8. A flexible circuit board as claimed in claim 7, wherein said second circuit element is a magnetic head for recording information of photography onto said magnetic recording layer and for reading information magnetically, and said first circuit element is a magnetic head interface IC for reproducing signals that is read out by said magnetic head and for sending information of photography to said magnetic head.

* * * * *